United States Patent [19]

Tanaka

[11] Patent Number: 5,091,207

[45] Date of Patent: Feb. 25, 1992

[54] PROCESS AND APPARATUS FOR CHEMICAL VAPOR DEPOSITION

[75] Inventor: Hitoshi Tanaka, Sagamihara, Japan

[73] Assignee: Fujitsu Limited, Kawasaki, Japan

[21] Appl. No.: 554,369

[22] Filed: Jul. 19, 1990

[30] Foreign Application Priority Data

Jul. 20, 1989 [JP] Japan .................. 1-186008

[51] Int. Cl.⁵ .............................. C23C 16/00
[52] U.S. Cl. ......................... 427/8; 427/248.1; 118/666; 118/715; 118/725; 118/50
[58] Field of Search ............... 118/666, 715, 725, 50; 427/8, 248.1

[56] References Cited

U.S. PATENT DOCUMENTS

| | | | |
|---|---|---|---|
| 3,603,284 | 9/1971 | Garnache | 118/725 |
| 3,747,559 | 7/1973 | Dietze | 118/725 |
| 4,703,718 | 11/1987 | Enstrom | 118/725 |

FOREIGN PATENT DOCUMENTS

| | | | |
|---|---|---|---|
| 0157052 | 9/1985 | European Pat. Off. | |
| 63-238281 | 10/1988 | Japan | 118/715 |
| 2201164 | 8/1988 | United Kingdom | |

*Primary Examiner*—Richard Bueker
*Attorney, Agent, or Firm*—Staas & Halsey

[57] ABSTRACT

A process for chemical vapor deposition, in which a reactant gas is introduced into a reaction furnace containing a substrate on which a deposited layer is formed by a chemical reaction of the introduced reactant gas, and a used gas resulting from the chemical reaction is exhausted from the furnace through a plurality of exhaust ports disposed radially around an axis of flow of the exhaust gas introduced into the furnace, which comprises the steps of: exhausting the used gas during the forming of the deposited layer on the substrate through an exhaust system comprising; exhaust ports disposed symmetrically with respect to a plane which contains the axis and at a substantially uniform distance from the axis; and exhaust pipes extending from the exhaust ports, each of the pipes being provided with a conductance valve inserted therein and a sensor for measuring a temperature of the pipe surface, the temperature sensor being fixed to the outer surface of the pipe at a position between the exhaust port and the conductance valve, and the exhaust pipes having substantially the same shape, size, and heat capacity over the portion thereof between the exhaust port and the position at which the temperature sensor is disposed: and adjusting the conductance valves during the exhausting of the used gas to minimize the differentials among the temperature values measured by the temperature sensors. An apparatus for carrying out the process is also disclosed.

12 Claims, 16 Drawing Sheets

VERTICAL TYPE

PANCAKE TYPE

BARREL TYPE

HORIZONTAL TYPE

E ⇩ FOR EXHAUSTER

PROCESS AND APPARATUS FOR CHEMICAL VAPOR DEPOSITION

BACKGROUND OF THE INVENTION

1. Field of the Invention

The present invention relates to a process and an apparatus for chemical vapor deposition.

2. Description of the Related Art

The chemical vapor deposition (CVD) or vapor phase epitaxy (VPE) process is widely used in the semiconductor industry. The basic principle of CVD is that a reactant gas or gases are introduced into a reaction furnace or chamber of a CVD apparatus through an inlet port and an energy source such as heat, light, plasma, etc., is utilized to cause a chemical reaction and thereby deposit a semiconductor, a metal, an insulating substance, etc., on a substrate, and a used gas produced by the chemical reaction is immediately exhausted out of the CVD apparatus through one or more exhaust ports of the reaction furnace.

FIG. 1 schematically illustrates various types of CVD apparatuses currently in use, including (a) a vertical type, (b) a pancake type, (c) a barrel type, and (d) a horizontal type, in which "G" denotes an introduced reactant gas and "E" an exhaust gas.

The provision of a uniform flow of reactant gas(es) in the reaction furnace of a CVD apparatus is extremely important, to obtain a uniformly deposited layer or film, and the uniformity of the reactant gas flow in a reaction furnace depends significantly on the uniformity of the exhausting of a used gas through a plurality of exhaust ports.

A mass flow controller (MFC) is generally used to ensure a precise control of the flow of fluid. FIG. 2 shows an essential structure of an MFC.

As shown in the figure, a narrow bypass 102 for detecting the flow quantity branches from and rejoins a main flow path 101. A fluid flowing through the bypass 102 is heated by a heater 103, and the temperature distribution in the fluid is measured by temperature sensors 104a and 104b disposed upstream and downstream of the heater 103, respectively. When the flow quantity is zero, the upstream and the downstream temperature distributions are equal, and as the flow quantity is increased, the upstream temperature distribution is lowered and the downstream temperature distribution is raised. This relationship enables the flow quantity to be precisely determined. The thus-measured value in the form of an electric signal is fed to a control circuit 105, where the measured value is compared with a preset flow quantity value, and a control signal corresponding to the difference between these two values is transmitted to a drive motor 107 of an electric valve 106 inserted in a downstream portion of the main flow path 101, to adjust the valve 106 so that the flow quantity is kept at the preset value. An element 108 for ensuring a laminar flow provides a resistance to the fluid flow, to cause a pressure difference between both sides of the element 108. This pressure differential causes the fluid flow to branch off the main path 101 into the bypass 102.

An MFC having the above-mentioned structure cannot be practically used when adjusting the exhaust flow quantity of a CVD apparatus, for the following reason.

The exhaust flow from a CVD apparatus carries various byproducts resulting from the formation reaction of a deposit layer, and these byproducts adhere to the inside walls of a reaction furnace and an exhaust pipe, and thereafter, fall from the walls to form a flaky dust, which is carried by the exhaust flow. The bypass 102 for detecting the flow quantity, however, is very narrow, i.e., usually has a diameter of from about 0.2 to 0.5 mm, to ensure a high measuring sensitivity, and the flaky dust entrained in the exhaust flow and entering the narrow bypass 102 causes a blockage or choking of the bypass 102, to thereby make the measuring of flow quantity impossible, and consequently, the MFC cannot control the flow quantity. Accordingly, MFCs are not suitable for adjusting the exhaust flow of a CVD apparatus.

Therefore, various measures have been taken with regard to the exhaust ports of a CVD apparatus to provide a uniform gas flow in the reaction furnace.

FIGS. 3(a) and 3(b) show conventional vertical type CVD apparatuses in a plan view (a) and a perspective view (b), respectively. The apparatus shown in FIG. 3(a) is provided with exhaust pipes 741 and 742 having a uniform shape in the portion between a not-shown exhauster and two exhaust ports 731 and 732 of a furnace 710, and therefore, having a uniform conductance. In this arrangement, the quantities of two exhaust gas flows from the two exhaust ports 731 and 732 are equal, and thus the gas flow in the furnace is symmetrical. This conventional arrangement, however, has a drawback in that the arrangement of such an apparatus is very limited and has a very poor flexibility. Namely, first the positions of a not-shown exhauster and a reaction furnace 710 must be fixed. Moreover, when the number of exhaust ports is increased to three or four, to improve the uniformity of gas flow in the furnace, the piping around the furnace becomes complicated. The apparatus shown in FIG. 3(b) has a single exhaust port 731 and is provided with a plate 701 through which a plurality of openings 702 having different diameters are formed to adjust the conductance, i.e., the closer to the exhaust port, the smaller the opening diameter, to thereby provide a uniform gas flow in the furnace, and vice versa. To determined the size and position of such openings, a number of experiments must be carried out by actually operating the furnace with a gas flowing therethrough, which require a great deal of time and labor.

SUMMARY OF THE INVENTION

The object of the present invention is to provide a process and an apparatus for a chemical vapor deposition, in which the uniformity of a gas flow in the reaction furnace is greatly improved, neither a complicated piping around the furnace nor much time and labor consumption for experiments is required, and the arrangement of the apparatus is not limited.

To achieve the object according to the present invention, there is provided a process for chemical vapor deposition in which a reactant gas is introduced into a reaction furnace containing a substrate on which a deposited layer is formed by a chemical reaction of the introduced reactant gas, and a used gas caused by the chemical reaction is exhausted from the furnace through a plurality of exhaust ports disposed radially around an axis of flow of the reactant gas introduced into the furnace, which comprises the steps of:

exhausting the used gas during the forming of the deposited layer on the substrate through an exhaust system comprising; exhaust ports disposed symmetrically with respect to a plane which contains said axis and at a substantially uniform distance from the axis;

and exhaust pipes extending from the exhaust ports, each of the pipes being provided with a conductance valve therein and a sensor for measuring a temperature of the pipe surface, the temperature sensor being fixed to the outer surface of the pipe at a position between the exhaust port and the conductance valve, and the exhaust pipes having substantially the same shape, size, and heat capacity over the portion thereof between the exhaust port and the position at which the temperature sensor is disposed; and adjusting the conductance valves during said exhausting of the used gas to minimize differences among the temperature values measured by the temperature sensors.

According to the present invention, there is also provided an apparatus for carrying out a chemical vapor deposition process, in which a reactant gas is introduced into a reaction furnace containing a substrate on which a deposited layer is formed by a chemical reaction of the introduced reactant gas, and a used gas caused by the chemical reaction is exhausted from the furnace through a plurality of exhaust ports disposed radially around an axis of flow of the reactant gas introduced into the furnace, which comprises:

an exhaust system comprising; exhaust ports disposed symmetrically with respect to a plane which contains said axis and at a substantially uniform distance from the axis; and exhaust pipes extending from the exhaust ports, each of the pipes being provided with a conductance valve therein and a sensor for measuring a temperature of the pipe surface, the temperature sensor being fixed to the outer surface of the pipe at a position between the exhaust port and the conductance valve, and the exhaust pipes having substantially the same shape, size, and heat capacity over the portion thereof between the exhaust port and the position at which the temperature sensor is disposed.

The present invention uses as a control factor the temperature of the outer surface of an exhaust pipe heated by a hot exhaust gas flow to ensure a uniform exhaust through a plurality of exhaust ports disposed in the specified arrangement, and thereby improves the uniformity of the gas flow in the furnace.

DESCRIPTION OF THE PREFERRED EMBODIMENT

The present invention will be described in more detail by way of examples.

EXAMPLES

EXAMPLE 1

Figure 1A:
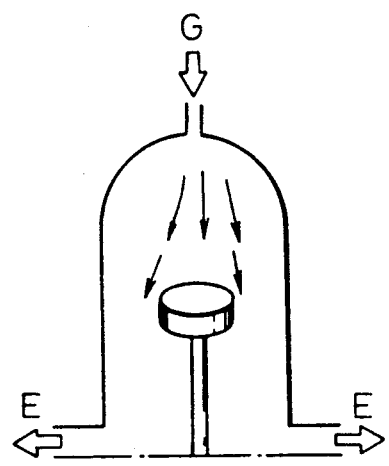
FIGS. 1(a) through 1(d) schematically illustrate various types of the CVD apparatuses currently in use, including (a) a vertical type, (b) a pancake type, (c) a barrel type, and (d) a horizontal type, and in which "G" denotes an introduced reactant gas and "E" an exhaust gas.
Figure 1B:
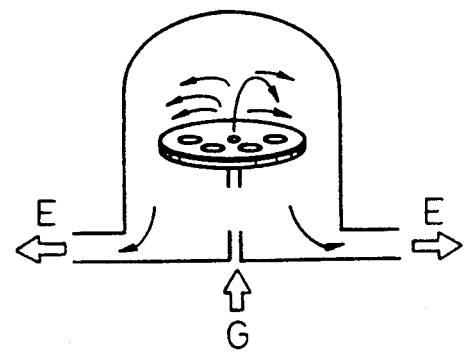
Figure 1C:
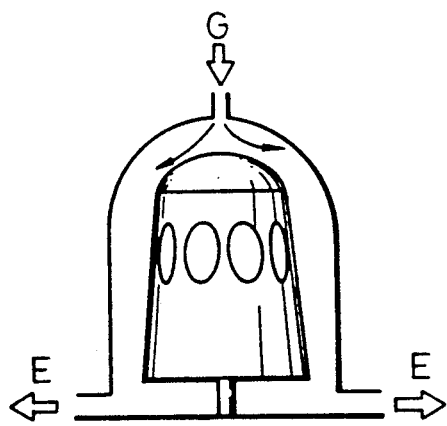
Figure 1D:
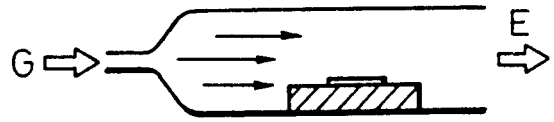
Figure 2:
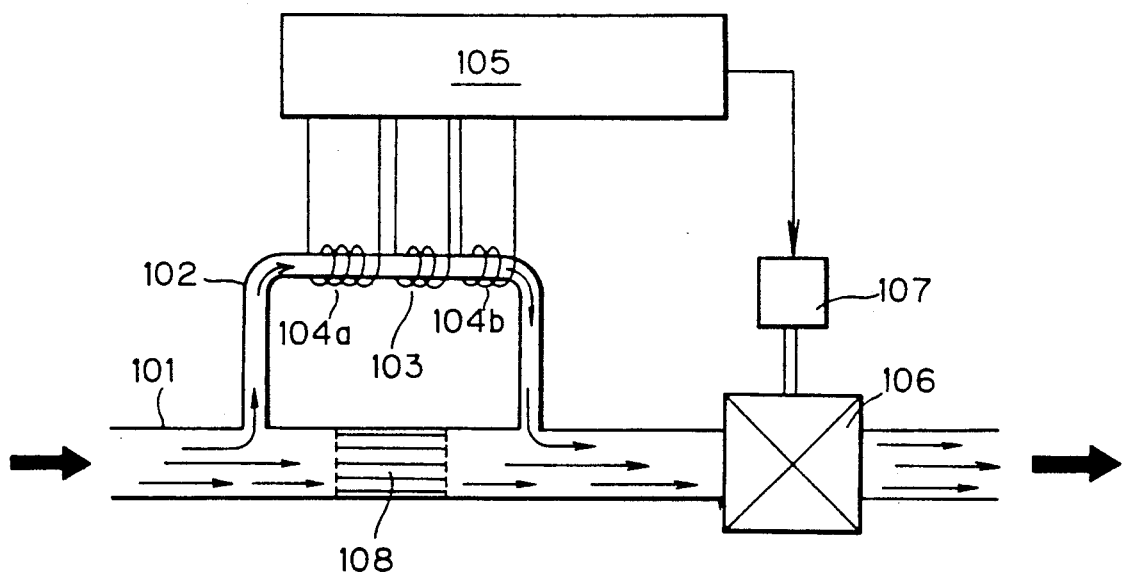
FIG. 2 shows an essential structure of a mass flow controller (MFC)
Figure 3A:
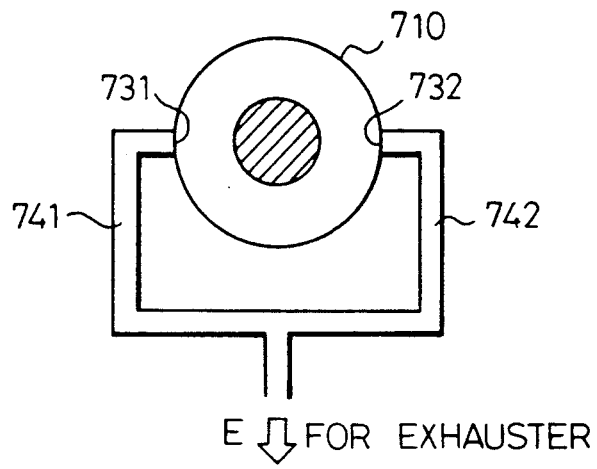
FIGS. 3(a) and 3(b) show conventional vertical type CVD apparatuses.
Figure 3B:
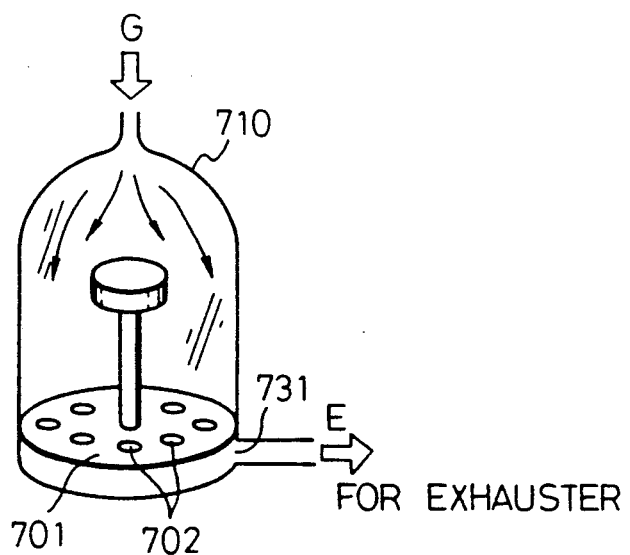
Figure 4A:
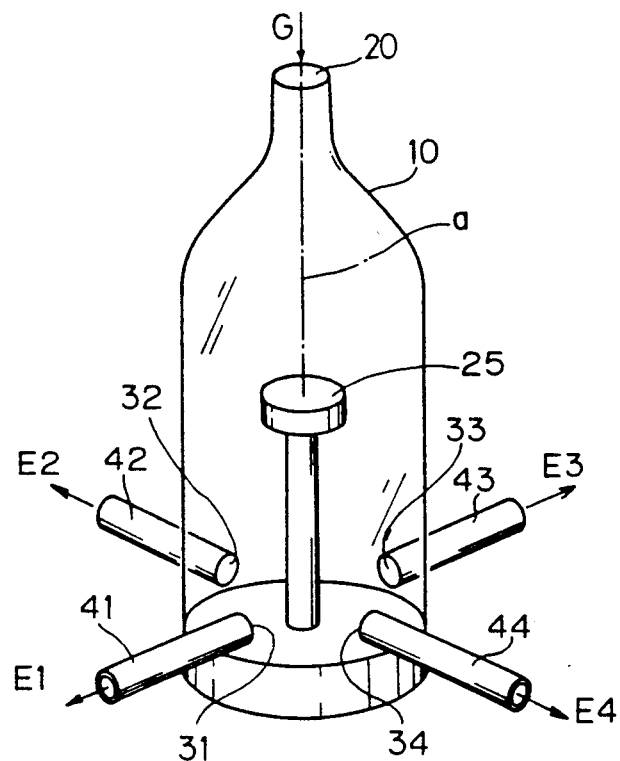
FIGS. 4(a) and 4(b) show a CVD apparatus according to the present invention, in a perspective view (a) and a plan view (b)
Figure 4B:
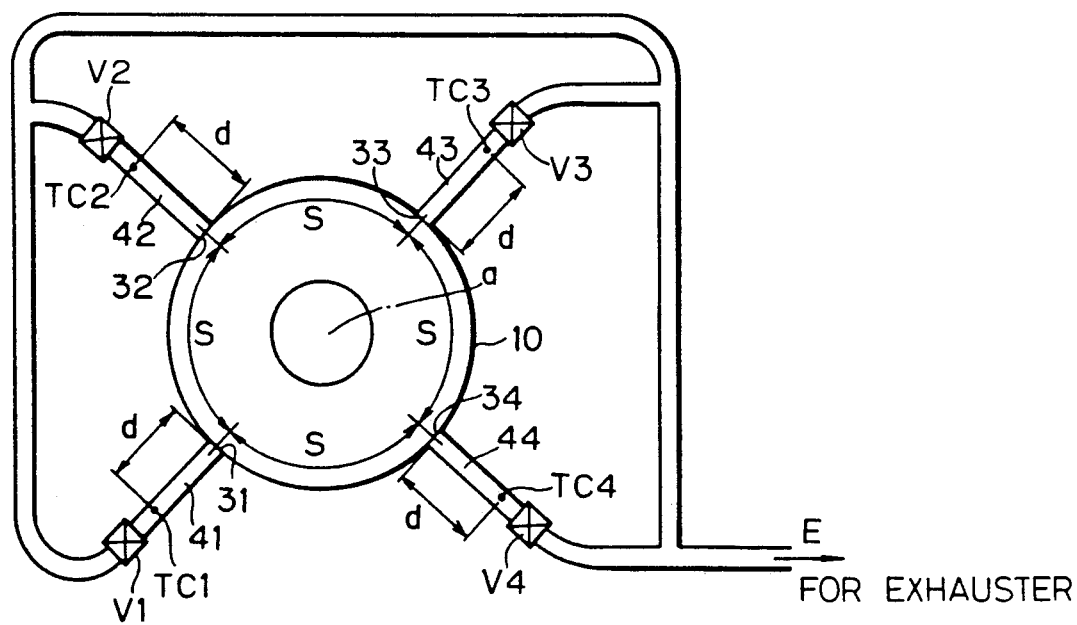

FIG. 4 shows a part of a vertical type CVD apparatus according to the present invention. As shown in the figure, a reaction furnace or chamber 10 is provided with an inlet 20 for reactant gases in the upper portion thereof and four exhaust ports 31, 32, 33, and 34 in the lower portion thereof, and contains a susceptor 25 therein. The exhaust ports 31 to 34 are disposed radially around an axis "a" of a flow of the reactant gas introduced into the furnace, at a uniform distance from the axis "a", and with a uniform distance "S" between neighboring ports. Exhaust pipes 41 to 44 extending from the exhaust ports 31 to 34, respectively are provided with conductance valves V1 to V4 (FIG. 4(b)), respectively. These conductance valves V1 to V4 adjust the flow quantity of the flow of used gas or exhausted gas E1 to E4 discharged from the respective exhaust ports 31 to 34. The exhausts E1 to E4 are passed through the conductance valves V1 to V4, and thereafter, are coalesced to form an exhaust E which is conducted to a not-shown exhauster.

The conductance valve to be used in the present invention is able to adjust the flow quantity by varying the conductance of a flow path system and may be a valve such that the adjusting function thereof is not hindered by dust entrained by an exhaust flowing therethrough. Conductance valves generally used include the three types shown in FIG. 5.

Figure 5:
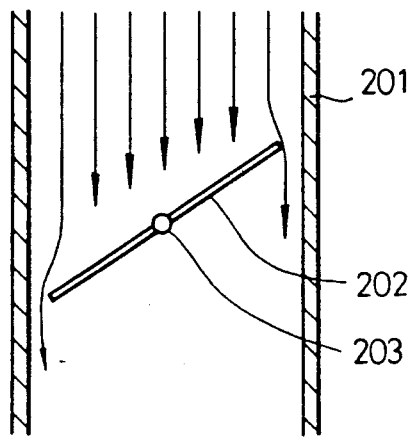
FIGS. 5(A1), 5(A2), 5(B1), 5(B2), 5(C1), and 5(C2) show typical conductance valves to be used in the present invention, in a longitudinal sectional view (A1, B1, C1) and a transverse sectional view (A2, B2, C2)
Figure 5:
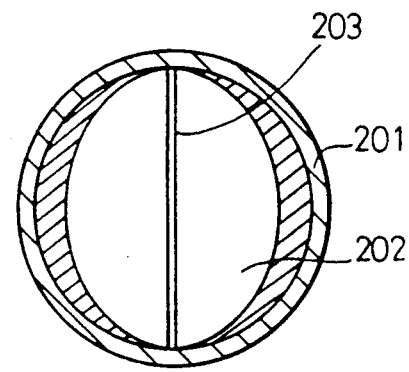
Figure 5:
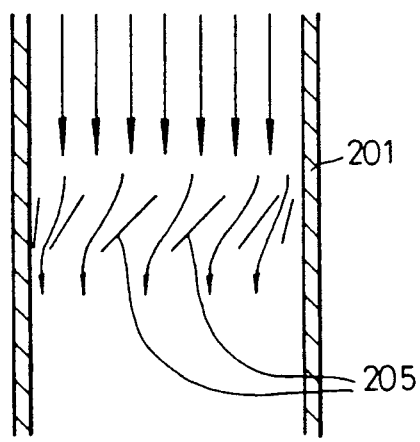
Figure 5:
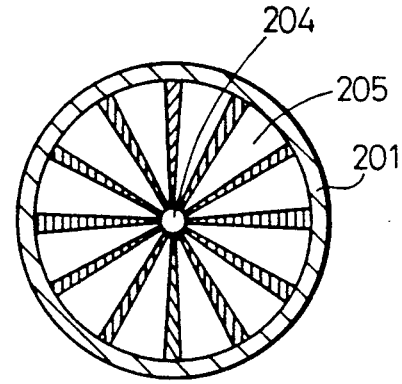
Figure 5:
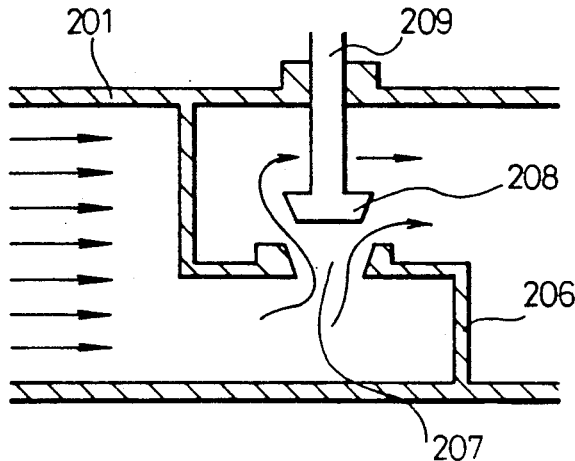
Figure 5:
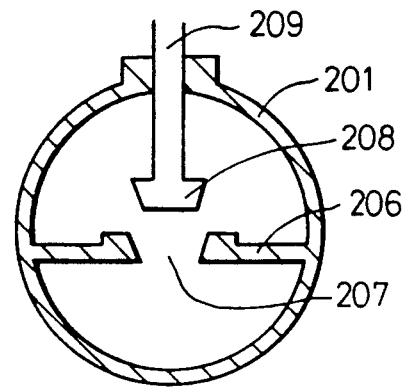

FIGS. 5(A1) and 5(A2) show a butterfly valve in a longitudinal section (A1) and a transverse section (A2), respectively, in which a butterfly-shaped shutter 202 adapted to the inner profile of a flow path 201 is rotated around an axis 203 crossing the flow path 201, to adjust the flow quantity. The axis 203 is connected to a not-shown manual handle or automatic-controlled drive motor placed outside the flow path 203, to rotate the shutter 202.

FIGS. 5(B1) and 5(B2) show a rotary-blade type valve in a longitudinal section (B1) and a transverse section (B2), respectively, in which a number of blades 205 extending radially from the center axis 204 of a flow path 201 having a circular section toward the circumference of the flow path 201 are synchronously rotated around the longitudinal axis thereof to adjust the flow quantity. The rotation of the blades 205 is effected by a suitable mechanism provided outside the flow path 201.

FIGS. 5(C1) and 5(C2) show a control valve in a longitudinal section (C1) and a transverse section (C2), respectively, in which the flow quantity is adjusted by varying the distance from a plug member 208 to a through hole 207 formed in a partition wall 206 crossing a flow path 201, to thereby vary the effective aperture of the through hole 207. The control valves are classified in accordance with the shape of the plug member for a globe valve as shown, and a needle valve for applications under high pressures, etc. The plug member 208 is operated manually or automatically from outside the flow path 201.

A feature of the control valve is that the flow quantity adjusting function thereof is stably effective over substantially the whole range of the valve aperture or the distance between the plug member 208 and the through hole 207; in the former two types of valves, the flow quantity adjusting function is relatively poor for a valve aperture range almost fully open.

As sensors for measuring a temperature of the pipe surface according to the present invention, thermocouples TC1 to TC4 are provided on the outer surface of the pipes 41 to 44 between the exhaust ports 31 to 34 and the conductance valves V1 to V4, respectively.

The thermocouple may be any generally used for measuring temperature, such as a chromel-alumel thermocouple, a platinum-rhodium platinum thermocouple, etc.

Figure 6A:
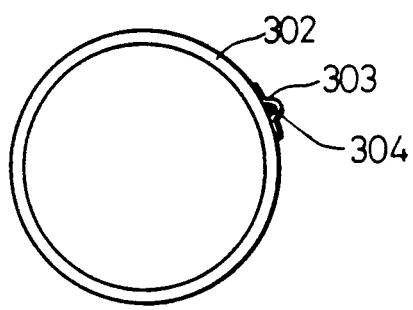
FIGS. 6(a) and 6(b) show an exhaust pipe to which a thermocouple is fixed for measuring the temperature of the outer surface of the pipe, according to the present invention, in a transverse sectional view (a) and a perspective view (b)
Figure 6B:
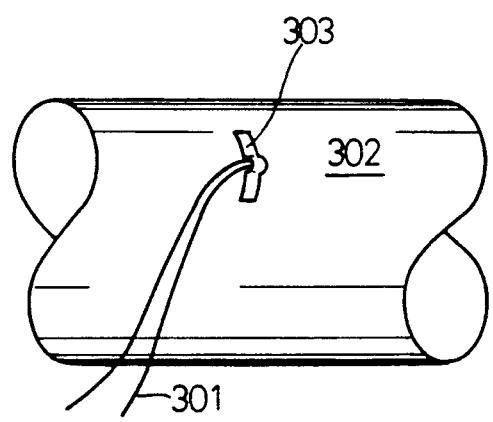

For example, as shown in FIG. 6, the thermocouple 301 (or TC1, TC2, TC3, or TC4 in FIG. 4) is fixed to the surface of an exhaust pipe 302 in such a manner that the temperature sensing portion or susceptible tip 304 is in contact with the pipe surface. The thermocouple 301 is preferably fixed by winding the susceptible tip 304 with a adhesive tape 303 or other adhesive agents having a good heat conductivity, to enhance the heat conduction from the pipe surface to the susceptible tip 304 of the thermocouple 301, and thus enhance the temperature measuring sensitivity.

The exhaust pipes 31 to 34 have substantially the same shape, size, and heat capacity over the portion thereof between the exhaust ports 31 to 34 and the thermocouples TC1 to TC4. The term "shape" used herein includes the shape of the section and the morphology of the piping arrangement, and the term "size" includes the sectional sizes (pipe wall thickness, outer diameter, inner diameter) and the pipe length for the piping arrangement. The material of the exhaust pipe is selected so that the heat capacities of the pipes in the above-mentioned portion are substantially equal.

The material of the exhaust pipe is not specifically limited and usually stainless steels are used, from the viewpoint of corrosion resistance, etc. The shape of the section of the exhaust pipe is not specifically limited, but is usually circular or may be polygonal. Further, the size of the exhaust pipe is not necessarily limited, but usually the pipe diameter is from ½ to 2 inches and the pipe wall thickness is from 2 to 5 mm. In the case of a low pressure CVD, exhaust pipes having a relatively thick wall (around 5 mm, for example) are used, to ensure a sufficient strength to withstand atmospheric pressure.

In this example, a stainless steel pipe having constant outer and inner diameter and a circular section is used to form the linear pipings 41 to 44 from the exhaust ports 31 to 34 to the conductance valves V1 to V4, and the thermocouples TC1 to TC4 are fixed to the pipe surface at positions of a uniform distance "d" from the exhaust ports 31 to 34. The temperatures detected by the thermocouples TC1 to TC4 are displayed on a suitable monitor panel.

The distance "d" from the exhaust ports 31 to 34 to the corresponding thermocouples TC1 to TC4 is preferably from 50 to 200 mm, to ensure a sufficient temperature variation in accordance with the gas flow quantity. If the distance "d" is too small, the temperature is actually measured at the flange portion connecting the pipe end to an exhaust port and having a relatively large heat capacity, and therefore, the temperature variation corresponding to the flow quantity variation is disadvantageously small. If the distance "d" is too large, the temperature of the pipe surface is excessively lowered and the measuring accuracy becomes poor.

The improved uniformity of gas flow according to the present invention is achieved by the following principle.

A reactant gas "G" introduced into the chamber 10 of a CVD apparatus is diverged substantially uniformly around the gas flow axis "a" to reach the susceptor 25 heated to and held at a predetermined temperature, for forming a desired deposited layer, for example, by a not-shown induction coil, surrounding the chamber 10. The introduced gas is heated by the susceptor 25 and then flows toward the exhaust ports 31 to 34. The exhaust flows E1 to E4 enter the exhaust pipes 41 to 44 through the exhaust ports 31 to 34, heat up the pipes 41 to 44, and are cooled by the corresponding heat loss. The temperature of the pipes 41 to 44 are raised to a temperature at which an equilibrium is established between the heat input from the exhaust flows E1 to E4 and heat released to the atmosphere. The heat input at an arbitrary section of a pipe depends on the amount of heat passing through the section, i.e., the temperature and the flow quantity of the exhaust gas. The heat released to the atmosphere is affected by the air convection around the pipe. From this relationship, the temperature of the pipe outer surface can be related to the flow quantity of exhaust gas passing through the pipe section at which the temperature is measured, with the proviso that the shape (sectional shape, piping arrangement morphology), size sectional size, piping length), and heat capacity are uniform for all of the exhaust pipes over the portion thereof between the exhaust port and the position at which the temperature is measured. Utilizing this phenomenon, the differentials among the exhaust flow quantities passing through the exhaust pipes can be minimized by adjusting the conductance valves so that the differentials among the temperatures of the outer surfaces of the exhaust pipes are minimized. The conductance valves are preferably adjusted so that the maximum temperature differential among the pipes is within about 1° C.

When such an adjustment has been achieved according to the present invention, the flow quantities of the exhaust gases E1 to E4 entering the exhaust ports 31 to 34 are uniform.

The exhaust ports 31 to 34 are disposed radially around the flow axis "a" of the introduced reactant gas at a uniform distance from the axis "a" and with a uniform distance "S" between neighboring exhaust ports. Therefore, after reaching the susceptor 25, the introduced gas is conducted toward the exhaust ports 31 to 34 while being diverged uniformly and radially around the axis "a" to cause a uniform gas flow in the furnace 10.

The temperature of the pipe outer surface is measured at a position between an exhaust port and a conductance valve, because a conductance valve has a significantly larger heat capacity than that of an exhaust pipe, which means that the gas temperature drops significantly when passing through a valve, and therefore, the pipe outer surface temperature is significantly lowered to cause a poor temperature measuring accuracy at a position downstream of a conductance valve.

The adjustment of the conductance valves can be very simply carried out by a manual control in accordance with the displayed surface temperatures for the respective exhaust pipes, or may be controlled automatically by using the measured temperature values.

In practice, preferably the conductance valves are initially adjusted by flowing a carrier gas only, and the reactant gases are then introduced to start the formation of a desired deposited layer. This procedure is advantageous in that it further improves the uniformity of a deposited layer; because a deposited layer is not formed during the initial adjustment of valves, and therefore, the formation of deposited layer can not be affected by a significant fluctuation of the exhaust flow quantity during the initial adjustment.

In such an initial adjustment carried out by using only a carrier gas, the susceptor may be heated to a temperature higher than that used for actually forming a deposited layer, and thus the exhaust gas is also heated to a relatively higher temperature. The thus heated exhaust holds a greater amount of heat, and accordingly, the measuring of the temperature is less affected by any disturbance and the absolute value of the measured temperature of the pipe outer surface is also greater, and thus, the accuracy of the measured temperature is enhanced.

The following is an example in which a GaAs film is formed on a 2-inch wafer by a metalorganic CVD (MOCVD) process and by using the apparatus shown in FIG. 4, according to the present invention.

Figure 7:
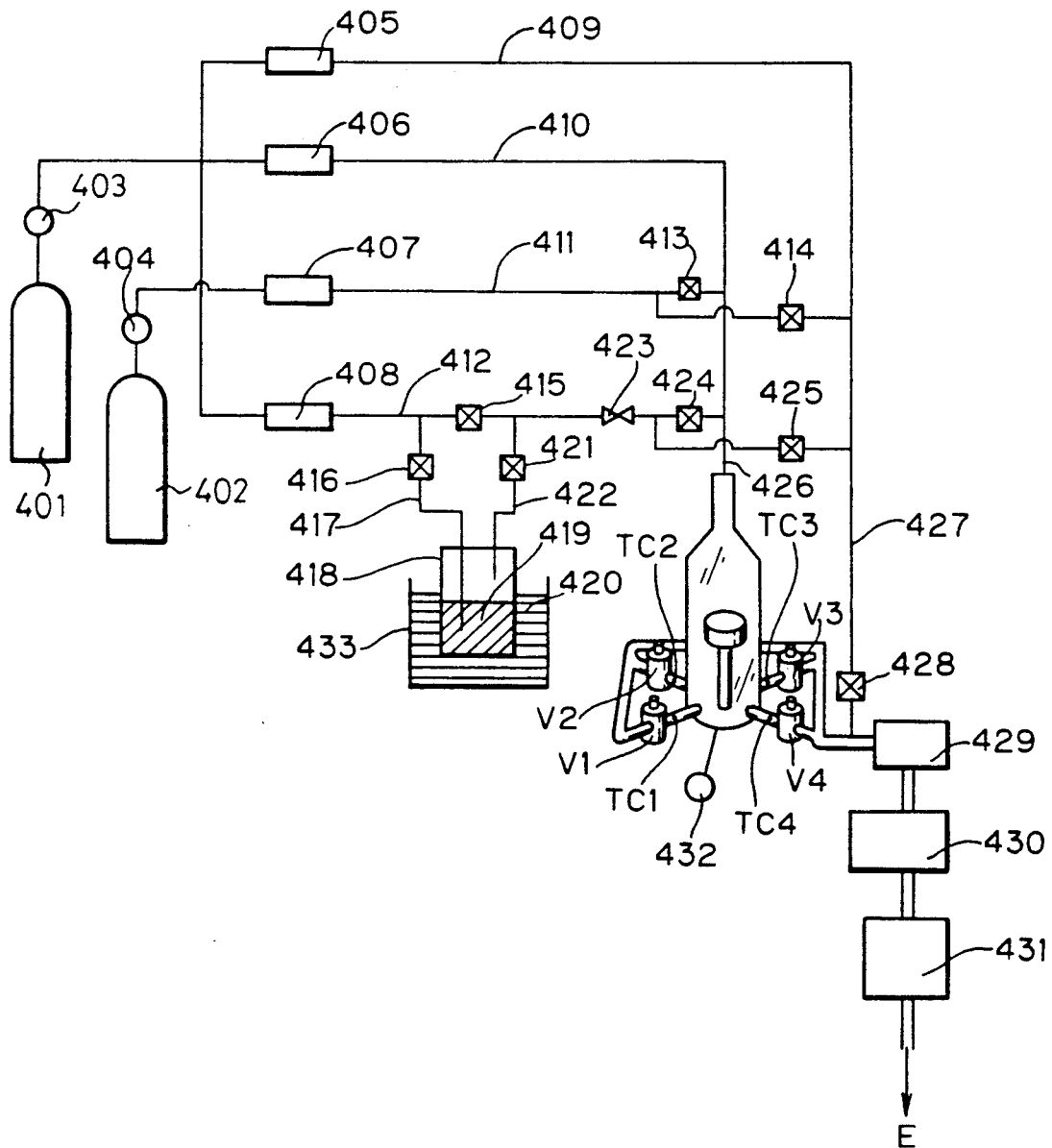
FIG. 7 shows an arrangement of a CVD apparatus according to the present invention.

FIG. 7 shows an overall arrangement of a CVD apparatus (MOCVD or MOVPE apparatus in this case) including the reactant gas supply, a reaction furnace, and the final exhaust.

In the figure, a container 401 of a carrier gas $H_2$ is provided with a pressure regulating valve 403, a container 402 of arsine gas $AsH_3$ as an As source is provided with a pressure regulating valves 404, and mass flow controllers 405 to 408 control the flow quantities of the carrier gas $H_2$ and the arsine $AsH_3$. The flow quantity of the arsine gas from the container 402 is adjusted by the mass flow controller 407 and is supplied through a pipe 411, a valve 413, and a pipe 426 to the reaction furnace 10, while the flow quantity of the carrier gas $H_2$ from the container 401 is adjusted by the mass flow controller 406 and is then mixed with the arsine gas in the pipe 426 to dilute the arsine gas to a predetermined concentration before being supplied to the reaction furnace 10. A valve 414 is closed during the supply of the arsine gas or an As source.

A closed bin 418 stores liquid trimethylgallium 419 as a Ga source. The flow quantity of the carrier gas $H_2$ from the container 401 is adjusted by the mass flow controller 408 and is supplied through a pipe 412, a valve 416, and a pipe 417 to the liquid trimethylgallium 419 stored in the container 418, to bubble the liquid 419 and form a Ga source gas containing a trimethylgallium vapor, which then flows into a pipe 422 and is supplied through a valve 421, a needle valve 423, a valve 424, and a pipe 426 to the reaction furnace 10. The valves 415 and 425 are closed during the supply of the Ga source gas.

The closed bin 418 is immersed in a liquid mixture 420 of 1:1 of water and ethylene glycol held at 0° C. in a vessel 433, to hold the liquid trimethylgallium 419 at 0° C. in the closed bin 418. A bubbler is composed of the closed bin 418 containing the liquid trimethylgallium 419, the vessel 433 containing the liquid mixture 420, the pipes 417 and 422, and the valves 415, 416 and 421.

A used gas resulting from the chemical reaction at the susceptor 25 in the reaction furnace 10 is separated and passed the conductance valves V1 to V4, and thereafter, coalesced to a single flow E which is exhausted through a filter 429, a rotary pump 430, and a neutralizer 431 for arsine gas.

When the As source gas (arsine) or the Ga source gas is not to be supplied to the reaction furnace 10 although the flow of these source gases is maintained, the valve 413 is closed and the valve 414 is opened or the valve 424 is closed and the valve 425 is opened, respectively, to exhaust the source gas through the pipe 427 and the valve 428.

When the bubbling in the closed bin 418 is not to be effected while the carrier gas $H_2$ is only supplied to the reaction furnace 10, the valve 424 is opened and the valves 415 and 425 are closed.

The line through the mass flow controller 405 and the pipe 409 is provided to prevent a back flow when the As source gas and the Ga source gas both are simultaneously discharged to the exhaust lines 429 through 431.

The needle valve 423 sustains a pressure differential between an atmospheric pressure on the side of the bubbler and a low pressure of, for example, around 60 Torr on the side of the reaction furnace, when a low pressure CVD is carried out.

In the arrangement of FIG. 4, the carrier gas $H_2$ only is initially supplied through the line of the mass flow controller 406 and the conductance valves are adjusted.

The 100 mm dia. and 50 mm thick carbon susceptor 25 is then heated to 800° C. by a high frequency induction heating, while the carrier gas $H_2$ is supplied at a flow rate of 2 l/min through the line of the mass flow controller 406, so that the pressure within the reaction furnace 10 becomes 60 Torr. When the conductance valves V1 to V4 of FIG. 4(b) are fully open, the thermocouples TC1, TC2, TC3, and TC4, which are fixed to the outer surface of the exhaust pipes 41, 42, 43, and 44 at a uniform distance of 50 mm from the corresponding exhaust ports 31, 32, 33, and 34, respectively, measure the different temperatures, which are higher for the latter thermocouples, as summarized in Table 1, column (1). This shows that the closer to the exhaust line a conductance valve is located, the larger the quantity of gas flowing through the valve. This tendency is easily understood from the variation of conductance between the exhaust pipes 41 to 44. The temperature fluctuation or the maximum differential among the measured values was 11.8° C.

TABLE 1

| Thermocouple | (1) Fully Open | (2) Adjusted |
| --- | --- | --- |
| TC1 | 36.8° C. | 41.2° C. |
| TC2 | 40.1° C. | 41.7° C. |
| TC3 | 44.3° C. | 41.8° C. |
| TC4 | 48.6° C. | 41.4° C. |

The conductance valves V1 to V4 are then adjusted so that the flow quantities become uniform among the pipes 41 to 44. Gas flows at the least quantity through the valve V1 which is most distant from the exhaust line, and accordingly, the adjustment is carried out in a manner such that the valve V1 is kept fully open and the apertures of the valves V2 to V4 are reduced, so that the closer to the exhaust line a valve is located, the greater the reduction of the aperture of the valve. Such an adjustment is very simple because it can be carried out by an operator in accordance with the temperature values indicated on a display panel. After about 30 minutes, the temperature fluctuation was decreased to 0.6° C. as shown in Table 1, column (2). This shows that the flow quantities passing the valves V1 to V4 were adjusted to be uniform, and therefore, the gas flow in the reaction furnace 10 was also considered to be uniform.

It is generally preferred to adjust the conductance valves so that the temperature fluctuation is not more than 1° C.

Figure 8:
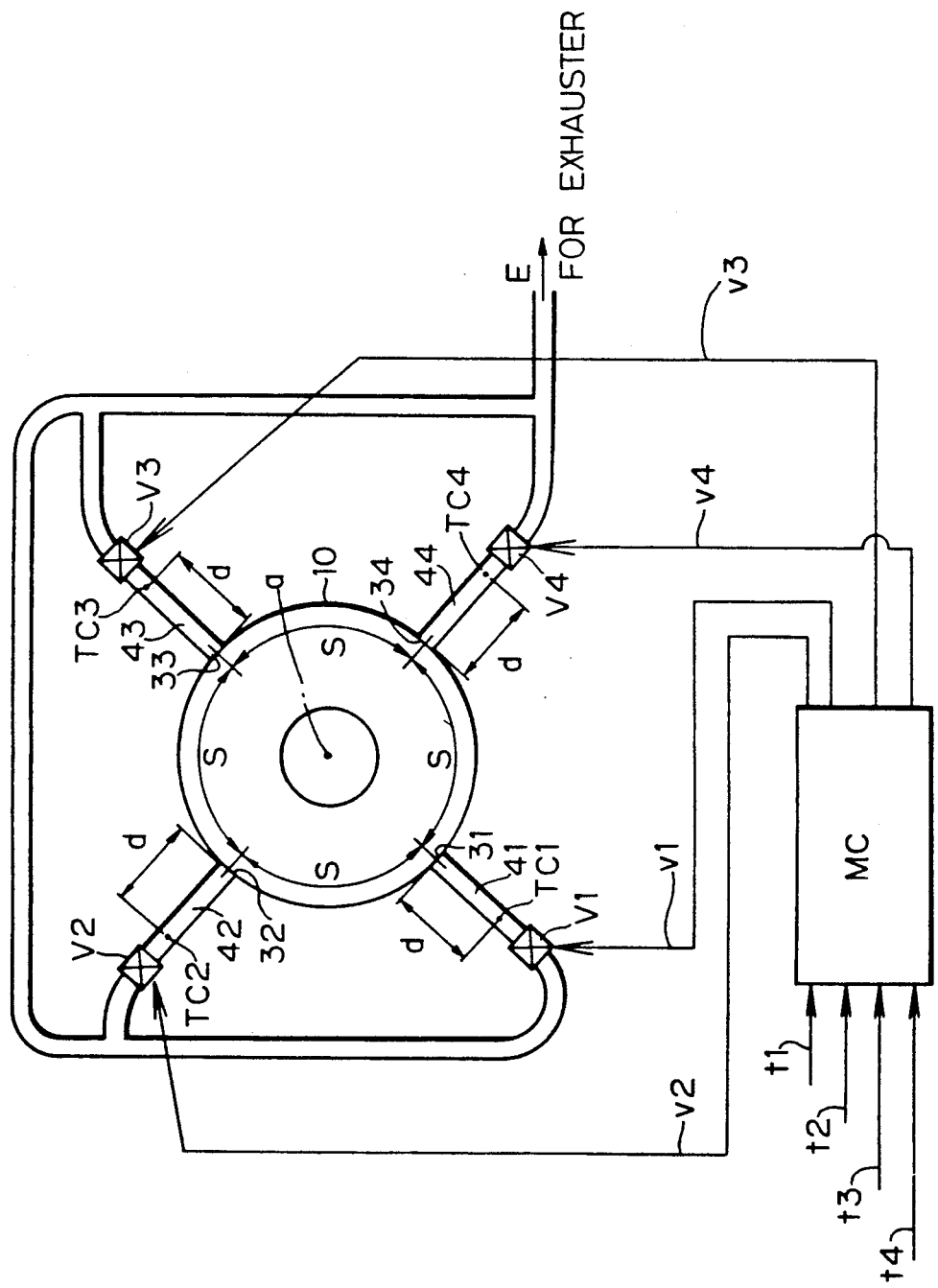
FIG. 8 shows an arrangement for an automatic adjustment of conductance valves provided in the CVD apparatus shown in FIG. 4.

Although conductance valves were adjusted manually in this example, the adjustment is preferably automatically controlled by using a control system such as shown in FIG. 8. The outputs t1 to t4 from the thermocouples TC1 to TC4 are input to a microcomputer MC, in which the inputs are subjected to an operation for executing the above-mentioned adjustment sequence, and control signals corresponding to the results obtained by the operation are successively output to the respective drive means of the conductance valves V1 to V4. The adjustment is typically carried out in the following sequence.

(1) The valves V1 to V4 are fully opened and the susceptor 25 is heated to 800° C.
(2) A period of 10 min is allowed to pass.
(3) The temperatures are measured by the thermocouples TC1 to TC4.
(4) The aperture of a valve Vi is reduced in accordance with a highest temperature measured by a thermocouple TCi.
(5) A period of 2 min is allowed to pass.
(6) Steps (4)-(5) are repeated until the temperature differential among the thermocouples TC1 to TC4 is reduced to 1° C. or less.

This sequence may be applied to both a manual adjustment and an automatically controlled adjustment.

The time elapsed before the fluctuation becomes 1° C. or less varies in accordance with a CVD apparatus used, although 30 min was required in the apparatus used in this example.

After the above-mentioned adjustment, a GaAs film was formed by a metalorganic CVD process under the following condition.
Deposition condition
total flow quantity: 2 l/min
carrier gas: $H_2$
As source gas: $H_2$-diluted 10% $AsH_2$ gas (0.5 l/min)
Ga source gas: trimethylgallium (bubbler gas $H_2$ is introduced at a flow rate of 0.005 l/min in a bubbler held at 0° C.)
susceptor temperature: 650° C.
depositing time: 30 min (deposited thickness: about 1 μm)

Figure 10A:
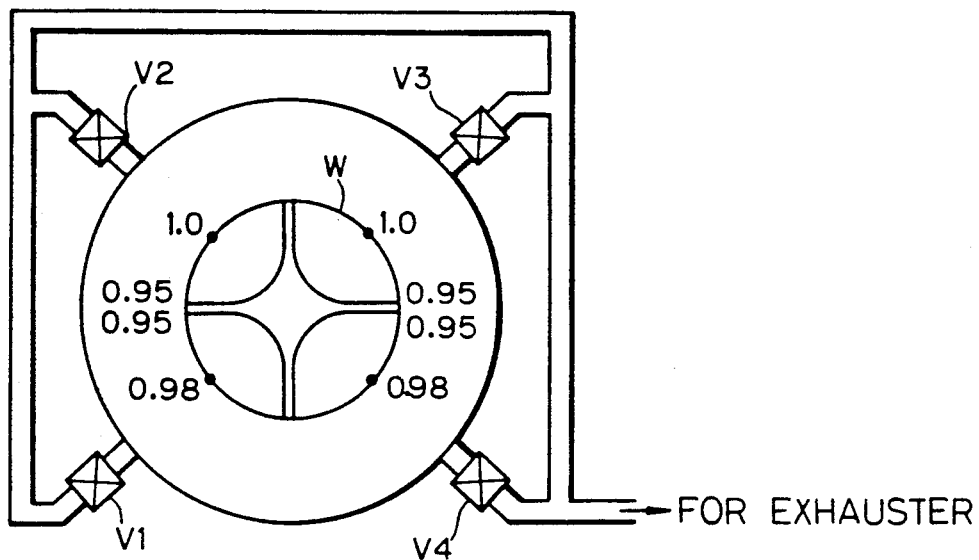
FIGS. 10 through 13 are plan views showing the thickness distributions with the contour lines of a thickness of a deposited layer formed on a stationary wafer in relation to the position of exhaust ports for examples according to the present invention (a) and comparative examples (b), in which FIGS. 10(ax) and 10(bx) detail FIGS. 10(a) and 10(bx) for the wafer portion.
Figure 10B:
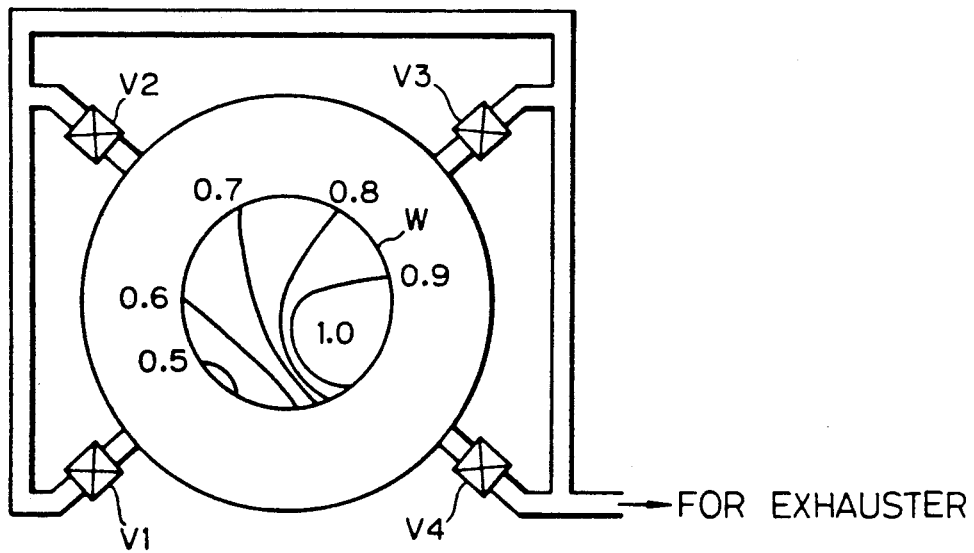
Figure 10:
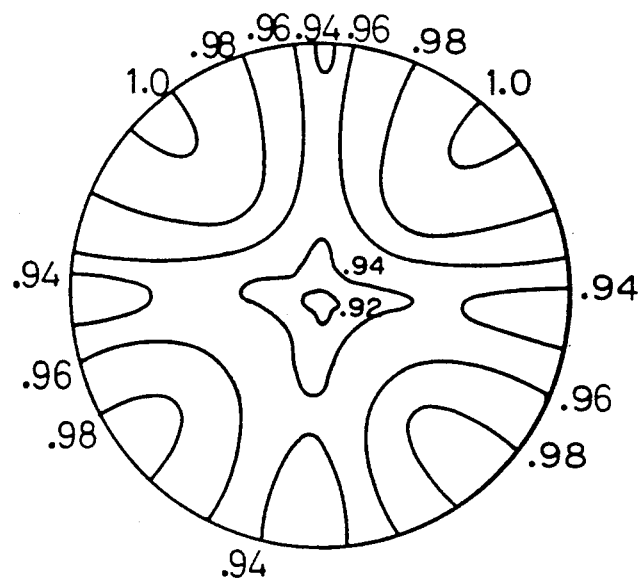
Figure 10:
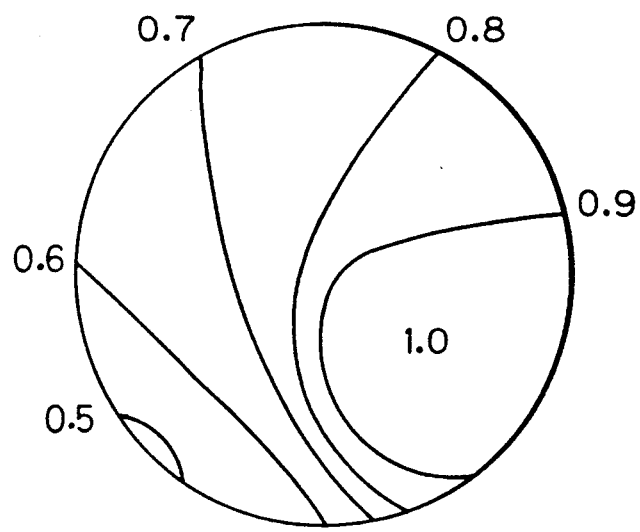

FIG. 10(a) shows the thickness distribution of the thus formed GaAs film on a 2-in water W and FIG. 10(ax) shows the same in further detail.

The numerals in the figures indicate the thickness in terms of a normalized value and the curves on the wafer W are contour lines of the thickness.

The thickness of the GaAs film was obtained by the following procedure.

Figure 9A:
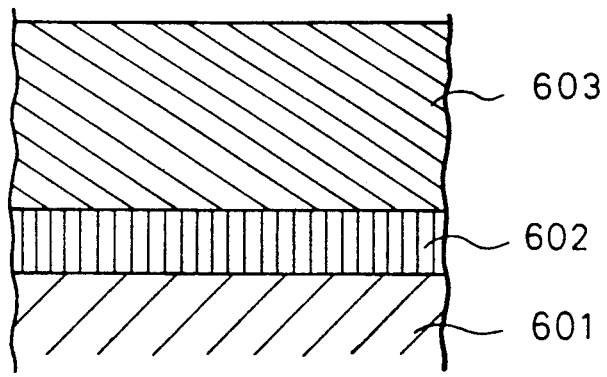
FIGS. 9(a) and 9(b) are sectional views for explaining a procedure for measuring the thickness of a deposited layer or film formed on a wafer.

As shown in FIG. 9(a), a 1000 Å thick $Al_{0.65}Ga_{0.35}As$ layer 602 was formed on a GaAs substrate 601 to provide a reference piece (601, 602), which was placed on the susceptor 25, and an about 1 μm thick GaAs susceptor 25, and an about 1 μm thick GaAs layer or film 603 was then formed on the $Al_{0.65}Ga_{0.35}As$ layer 602.

Figure 9B:
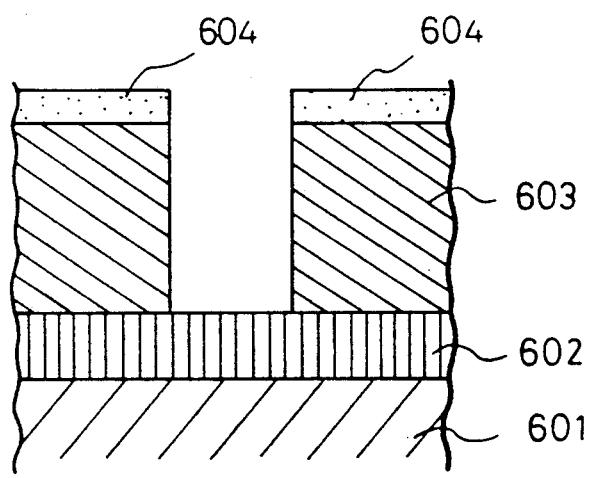

The GaAs film 603 was coated with a wax to a predetermined thickness, leaving an uncoated area having a predetermined width. The coated surface was etched with a mixture of $H_2O_2$, $H_2O$, citric acid, and aqueous ammonia. This etchant does not etch the $Al_{0.65}Ga_{0.35}As$ layer 602 but only etches and removes the GaAs layer 603 in the uncoated region, as shown in FIG. 9(b). The wax coating 604 was removed and the thickness of the GaAs layer 603 was measured with a step meter. The details of this method are described by P. M. Frijlink, in "A New Versatile, Large Size MOVPE Reactor", Journal of Crystal Growth, vol. 93 (1988), p. 207-215.

COMPARATIVE EXAMPLE 1

FIG. 10(b) shows the thickness distribution of a GaAs film formed under the same condition as in Example 1, except that the adjustment of the conductance valves V1 to V4 was not carried out, i.e., all the conductance valves were fully open. FIG. 10(bx) shows the same result in further detail.

Under the unadjusted condition of Comparative Example 1, in which all the conductance valves were fully open, the thickness fluctuation amounted to 50%.

In Example 1, in which the conductance valves were adjusted according to the present invention, the thickness fluctuation is reduced to 5%, and even if a dead flow point on the wafer center is taken into consideration, the fluctuation does not exceed about 10%. It is seen from this result that the uniformity of the gas flow in the reaction furnace is greatly improved according to the present invention.

EXAMPLE 2

Figure 11B:
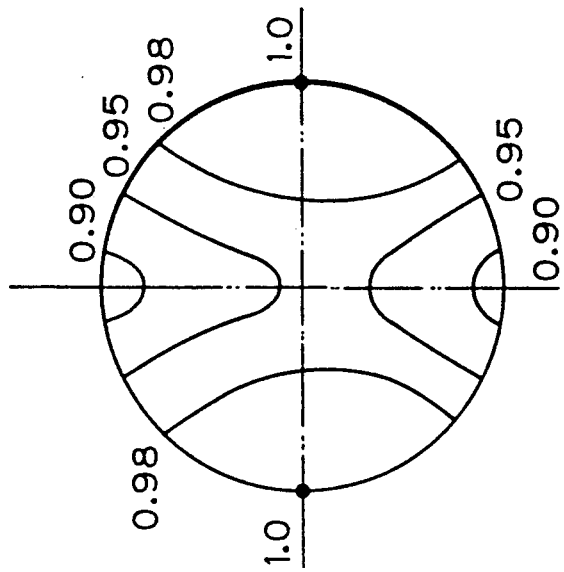
Figure 11A:
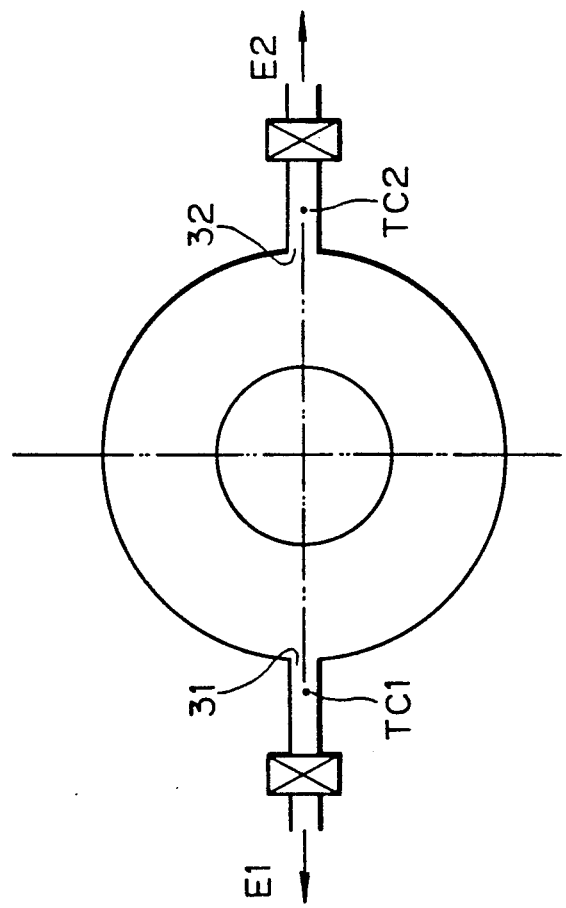

A GaAs film is formed under the same condition as in Example 1, except that the exhaust system comprised two exhaust ports 31 and 32 disposed according to the present invention, as shown in FIG. 11(a).

FIG. 11(b) shows the thickness distribution of the obtained GaAs film.

The thickness fluctuation was substantially within 10%.

EXAMPLE 3

Figure 12A:
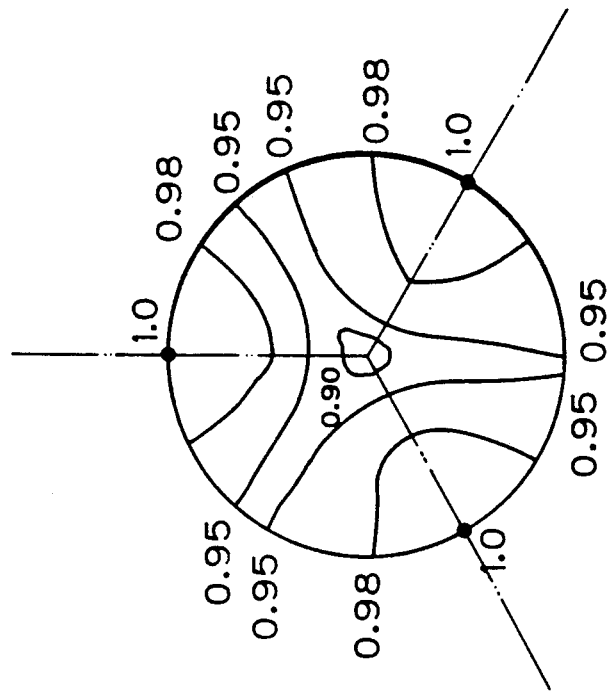

A GaAs film was formed under the same condition as in Example 1, except that the exhaust system comprised three exhaust ports 31, 32, and 33 disposed at a uniform distance between neighboring ports according to a preferred embodiment of the present invention, as shown in FIG. 12(a).

Figure 12B:
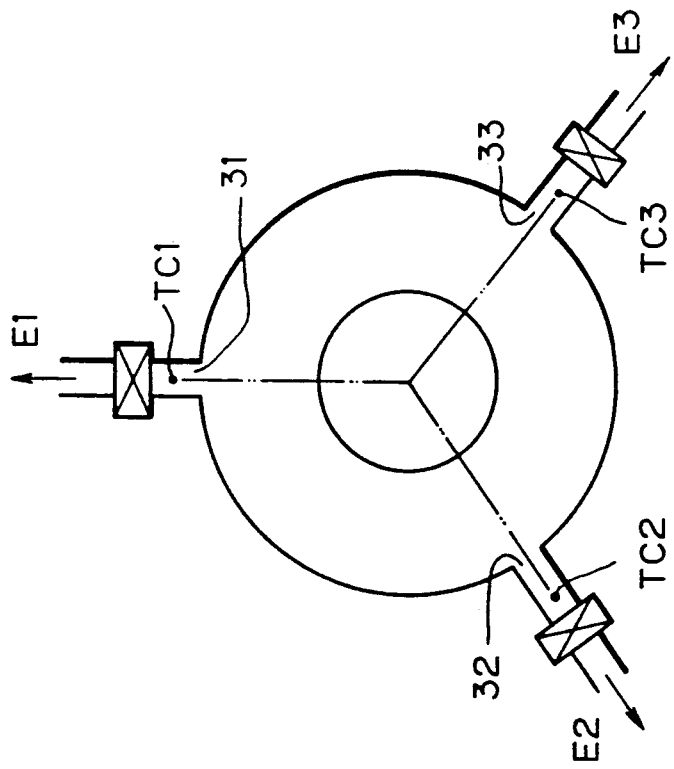

FIG. 12(b) shows the thickness distribution of the obtained GaAs film.

The thickness fluctuation was substantially within 10%.

EXAMPLE 4

Figure 13A:
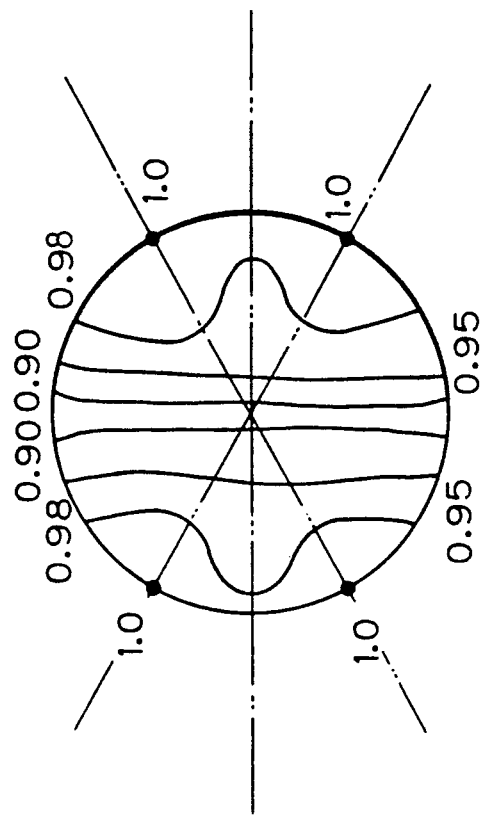

A GaAs film was formed under the same condition as in Example 1, except that the four exhaust ports 31 32, 33, and 34 were disposed in an arrangement such that the distances between the ports 31 and 32 and between the ports 33 and 34 were S1, and the distances between the ports 32 and 33 and between the ports 34 and 31 were S2 greater than S1, as shown in FIG. 13(a).

Figure 13B:
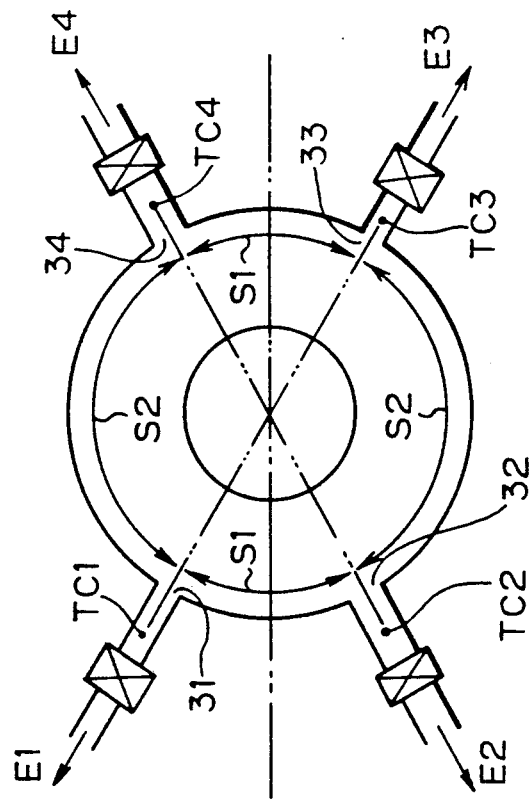

FIG. 13(b) shows the thickness distribution of the obtained GaAs film.

The thickness fluctuation was substantially within 10%.

In the preceding examples, the GaAs films were formed on a stationary wafer, but a wafer is usually rotated to improve the uniformity of the film thickness.

The rotation speed ranges, for example, from 3 to 60 rpm for 2-inch wafers. An example in which a wafer was rotated will be described below.

EXAMPLE 5

A GaAs film was formed under the same condition as in Example 1, except that the susceptor rotated during the formation of GaAs film at a rotation speed of 10 rpm in a plane parallel to the wafer surface and around the central axis of the wafer.

COMPARATIVE EXAMPLE 2

For comparison with Example 5, a GaAs film was formed under the same condition as in Comparative Example 1, except that the susceptor was rotated in the same manner as in Example 5.

Figure 14A:
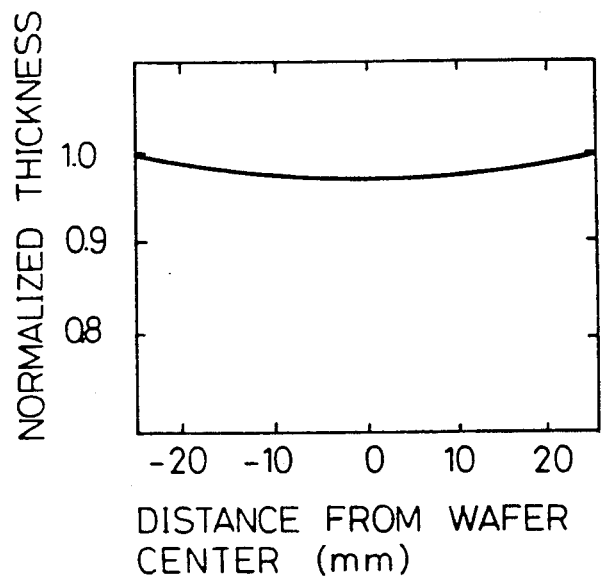
FIG. 14 shows the thickness distribution along the diameter direction of a deposited layer formed on a rotated wafer.
Figure 14B:
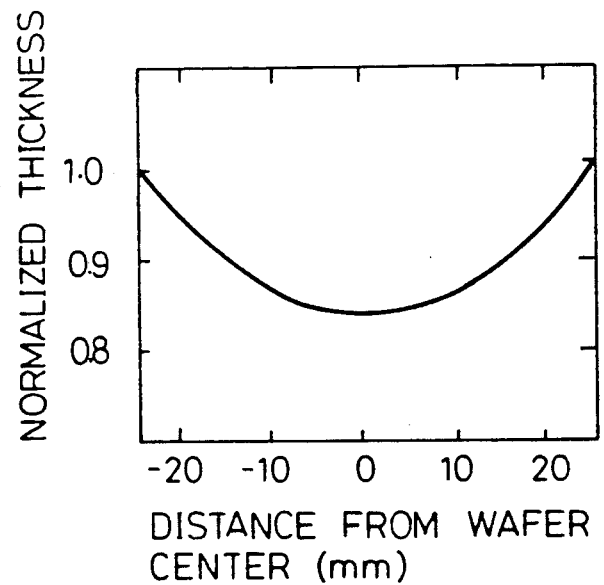

FIGS. 14(a) and 14(b) show the thickness distribution of the GaAs film obtained in Example 5 and Comparative Example 2, respectively, along the diameter of a wafer.

In Example 5 according to the present invention, the rotation of susceptor further improved the uniformity of the film thickness so that the thickness fluctuation was within about 3%.

In Comparative Example 2, the rotation of susceptor did not provide a sufficient thickness uniformity so that the thickness fluctuation still amounted to about 15%.

Figure 15:
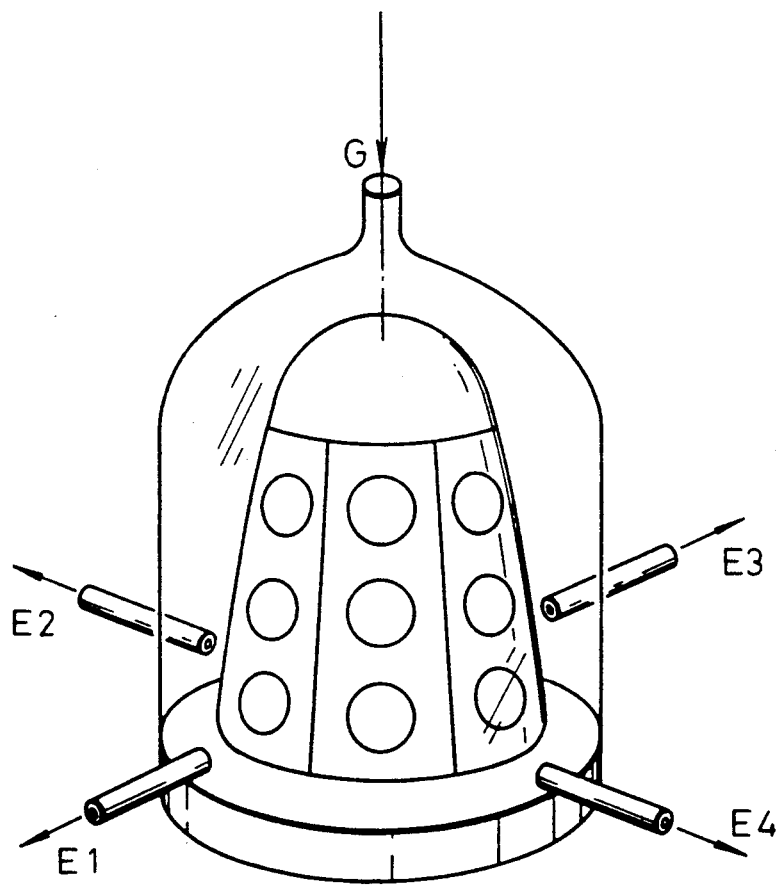
FIG. 15 shows the reaction furnace portion of a barrel type CVD apparatus according to the present invention, in a perspective view.

The above description includes cases in which a single wafer is processed in a vertical type CVD apparatus, but the present invention can be also applied to cases in which a number of wafers are processed in a barrel type CVD apparatus as shown in FIG. 15, for example. In the latter cases, the improved uniformity of the gas flow in a furnace according to the present invention more effectively provides a uniform film thickness between wafers than provides a uniform film thickness on a single wafer.

Although the above examples describe the formation of a GaAs film, the process and apparatus according to the present invention can be also applied to the formation of other films such as InP, Si, metals, and insulating substances, etc.

As described above, the present invention provides a process and an apparatus for chemical vapor deposition, in which the uniformity of a gas flow in the reaction furnace is greatly improved, a complicated piping around the furnace and time and labor for experiments are not required, and the arrangement of apparatus is not limited.

I claim:

1. A process for chemical vapor deposition, in which a reactant gas is introduced into a reaction furnace containing a substrate on which a deposited layer is formed by a chemical reaction of the introduced reactant gas, and a used gas resulting from the chemical reaction is exhausted from the furnace through a plurality of exhaust ports disposed radially around an axis of flow of the reactant gas introduced into the furnace, which comprises the steps of:

exhausting the used gas during a forming of the deposited layer on the substrate through an exhaust system comprising; exhaust ports disposed symmetrically with respect to a plane which contains said axis and at a substantially uniform distance from the axis; and exhaust pipes extending from the exhaust ports, each of the pipes being provided with a conductance valve inserted therein and a sensor for measuring a temperature of the pipe surface, the temperature sensor being fixed to the outer surface of the pipe at a position between the exhaust port and the conductance valve, and the exhaust pipes having substantially the same shape, size, and heat capacity over the portion thereof between the exhaust port and the position at which the temperature sensor is disposed; and adjusting the conductance valves during said exhausting of the used gas to minimize the differentials among the temperature values measured by the temperature sensors.

2. A process according to claim 1, wherein said exhaust ports are disposed in an arrangement such that distances between neighboring ports are substantially uniform.

3. A process according to claim 1, wherein said adjusting of the conductance valves is carried out so that the differentials among the temperature values are about 1° C. or less.

4. A process according to claim 1, wherein said adjusting of the conductance valves is carried out automatically.

5. A process according to claim 1, wherein the number of said exhaust ports is between two and four.

6. An apparatus for carrying out a chemical vapor deposition process, in which a reactant gas is introduced into a reaction furnace containing a substrate on which a deposited layer is formed by a chemical reaction of the introduced reactant gas, and a used gas resulting from the chemical reaction is exhausted from the furnace through a plurality of exhaust ports disposed radially around an axis of flow of the reactant gas introduced into the furnace, which comprises:

an exhaust system comprising; exhaust ports disposed symmetrically with respect to a plane which contains said axis and at a substantially uniform distance from the axis; and exhaust pipes extending from the exhaust ports, each of the pipes being provided with a conductance valve inserted therein and a sensor for measuring a temperature of the pipe surface, the temperature sensor being fixed to the outer surface of the pipe at a position between the exhaust port and the conductance valve, and the exhaust pipes having substantially the same shape, size, and heat capacity over the portion thereof between the exhaust port and the position at which the temperature sensor is disposed.

7. An apparatus according to claim 6, wherein said exhaust ports are disposed in an arrangement such that distances between neighboring ports are substantially uniform.

8. An apparatus according to claim 6, wherein the number of said exhaust ports is between two and four.

9. A process according to claim 2, wherein the number of said exhaust ports is between two and four.

10. A process according to claim 3, wherein the number of said exhaust ports is between two and four.

11. A process according to claim 4, wherein the number of said exhaust ports is between two and four.

12. A process according to claim 7, wherein the number of said exhaust ports is between two and four.

* * * * *

UNITED STATES PATENT AND TRADEMARK OFFICE
CERTIFICATE OF CORRECTION

PATENT NO. : 5,091,207

DATED : February 25, 1992

INVENTOR(S) : Hitoshi TANAKA

It is certified that error appears in the above-identified patent and that said Letters Patent is hereby corrected as shown below:

* Col. 2,   line 40,   change "determined" to --determine--.

* Col. 6,   line 51,   before "sectional" insert --(--.

* Col. 10,  line 5,    change "water" to --wafer--.

* Col. 11,  line 6,    after "31" insert --,--.

Signed and Sealed this

Nineteenth Day of October, 1993

Attest:

BRUCE LEHMAN

*Attesting Officer*     *Commissioner of Patents and Trademarks*